(12) United States Patent
Ichihara (10) Patent No.: US 6,249,560 B1
(45) Date of Patent: *Jun. 19, 2001

(54) PLL CIRCUIT AND NOISE REDUCTION MEANS FOR PLL CIRCUIT

(75) Inventor: Masaki Ichihara, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/763,967

(22) Filed: Dec. 10, 1996

(30) Foreign Application Priority Data

Dec. 15, 1995 (JP) .................................................. 7-326971

(51) Int. Cl.⁷ ........................................................ H03D 3/24
(52) U.S. Cl. .......................... 375/376; 375/376; 375/316; 375/215; 331/11
(58) Field of Search ..................................... 375/376, 375, 375/316, 215; 331/11, 1 A, 17; 455/260; 358/148

(56) References Cited

U.S. PATENT DOCUMENTS

| | | | |
|---|---|---|---|
| 4,791,488 | * 12/1988 | Fukazawa et al. | ..................... 358/149 |
| 4,831,338 | * 5/1989 | Yamaguchi | .......................... 331/1 A |
| 4,888,564 | * 12/1989 | Ishigaki | .................................. 331/1 A |
| 5,216,387 | * 6/1993 | Telewski et al. | ......................... 331/11 |
| 5,471,502 | * 11/1995 | Ishizeki | .................................. 375/376 |

FOREIGN PATENT DOCUMENTS 4127719    4/1992 (JP) .

OTHER PUBLICATIONS

Wakerly, John F., Digital Design Principles and Practices, Prentice–Hall, Inc., pp. 360–363, 442–445 & 450–457, 1990*

* cited by examiner

Primary Examiner—Stephen Chin
Assistant Examiner—Shuwang Liu
(74) Attorney, Agent, or Firm—Ostrolenk, Faber, Gerb & Soffen, LLP (57) ABSTRACT

The frequency divider output $a_2$ is provided to the D input of a first D flip-flop and an input clock $a_1$ to a first frequency divider is inversed by an inverter and is then provided to the C input of the first D flip-flop. The first frequency divider output $b_2$ is provided to the D input of a second D flip-flop, and an input clock $b_1$ to a second frequency divider is inversed by another inverter and then sent to the input C of the second D flip-flop. The Q output of the first D flip-flop and the Q output of the second D flip-flop are sent to a phase comparator as the output signal $a_3$ and the output signal $b_3$, respectively. In this way, the frequency divider outputs $a_2$ and $b_2$ are taken into the first and second D flip-flops at a point half behind the input clocks $a_1$ and $b_2$ and are provided to the phase comparator as the output signals $a_3$ and $b_3$.

22 Claims, 5 Drawing Sheets

FIG.5A FREQUENCY DIVIDER INPUT CLOCK a1, b1

FIG.5B FREQUENCY DIVIDER OUTPUT a2, b2

FIG.5C FREQUENCY DIVIDER NOISE n

FIG.5D FREQUENCY DIVIDER OUTPUT a2, b2

FIG.5E FREQUENCY DIVIDER NOISE n

US 6,249,560 B1

PLL CIRCUIT AND NOISE REDUCTION MEANS FOR PLL CIRCUIT

BACKGROUND OF THE INVENTION

The present invention relates to a PLL circuit. More specifically, this invention relates to the technology of the PLL circuit for reducing a noise of a PLL frequency synthesizer.

Conventionally, for example,the invention disclosed in JP-A-127719/1992 has been used as a PLL circuit of this kind. The PLL circuit comprises a voltage controlled oscillator, a frequency divider for dividing an output signal of the voltage controlled oscillator, a phase comparator for comparing a phase of the output signal of the frequency divider and the phase of a reference clock and detecting the phase difference, a charge pump circuit driven by the output signal of the phase comparator, and a loop filter for smoothing output of the charge pump circuit. The PLL circuit controls the frequency of the voltage controlled oscillator based on the output voltage of the loop filter.

Figure 4:
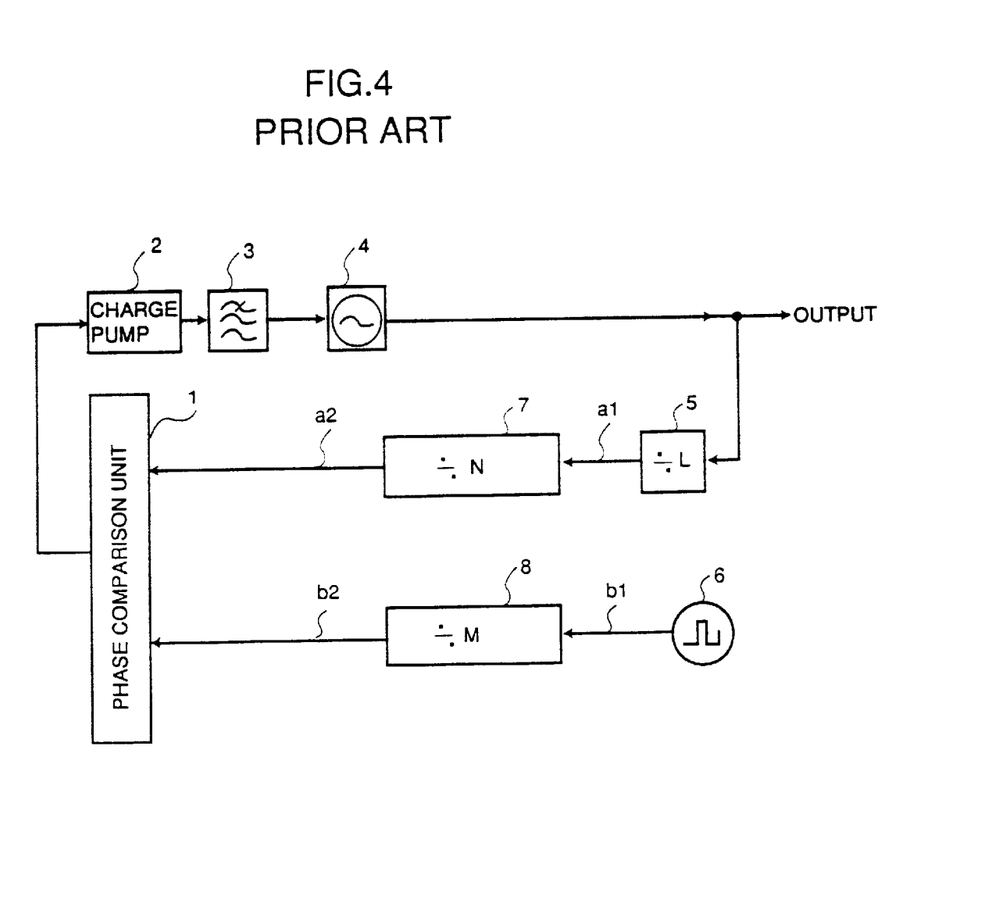
FIG. 4 is a block diagram of the conventional PLL circuit.
Figure 5A:
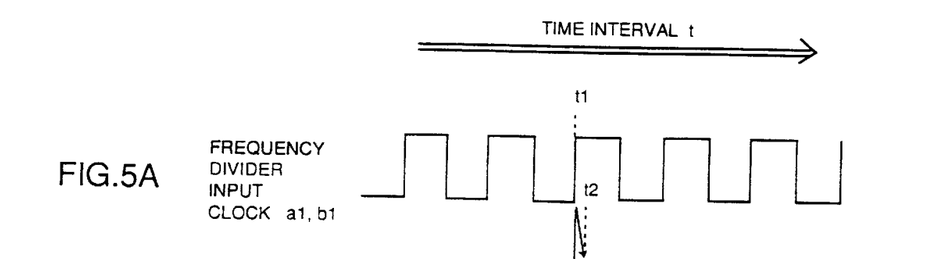
FIGS. 5A to 5E are time charts for explaining the operations of the conventional PLL circuit.
Figure 5B:
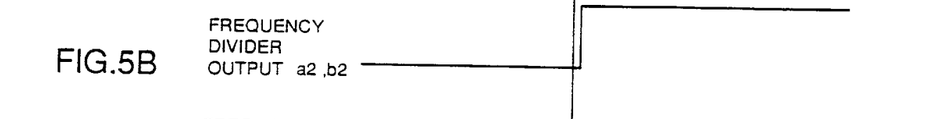
Figure 5C:
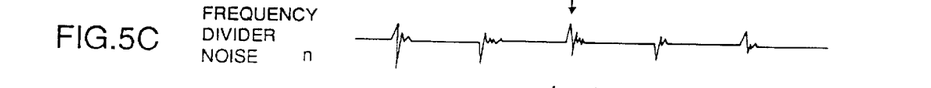
Figure 5D:
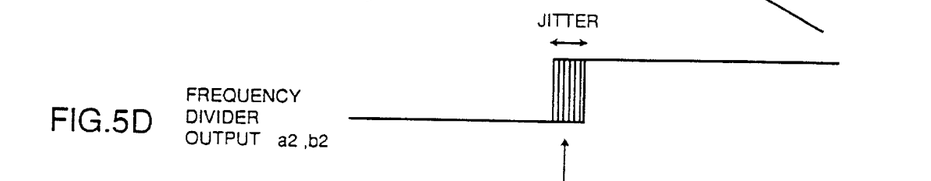
Figure 5E:
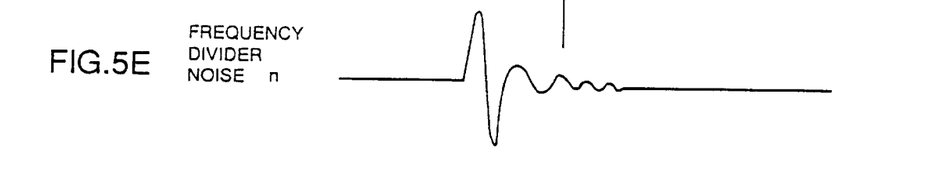

FIG. 4 shows the general composition of the PLL circuit disclosed in the JP-A-127719/1992. In FIG. 4, the numeral 1 is a phase comparator. The numeral 2 is a charge pump. The numeral 3 is a loop filter. The numeral 4 is a voltage controlled oscillator (referred to as VCO, hereinafter). The numeral 5 is a prescaler. The numeral 6 is a reference clock generation unit. The numeral 7 is a first frequency divider. The numeral 8 is a second frequency divider. The lower case $a_1$ is an output signal of the prescaler 5 (an input clock to the frequency divider 7). The lower case $b_1$ is a reference clock of the reference clock generation unit 6 (an input clock to the frequency divider 8). The lower case $a_2$ is an output signal of the frequency divider 7 (frequency divider output). The lower case $b_2$ is an output signal of the frequency divider 8 (frequency divider output).

In the PLL circuit, the output signal of the VCO 4 is divided by L by the prescaler 5 then divided by N by the frequency divider 7. The reference clock from the reference clock generation unit 6 is divided by M by the frequency divider 8. The upper cases L, M and N are natural numbers. The phase comparator 1 inputs the frequency divider output $a_2$ and $b_2$ and outputs the voltage proportionate to the phase difference of $a_2$ and $b_2$. The charge pump 2 is driven according to the output voltage of the phase comparator 1. The loop filter 3 smoothes output of the charge pump 2 and making the output a control voltage of the VCO 4. In this way, the PLL (a phase lock loop) is composed and negative feedback is applied to the phase comparator 1 in order to stabilize the input phase difference. The output frequency $f_0$ of the VCO 4 here is calculated as follows; $f_0=f_r \times N \cdot L/M$. In this expression, $f_r$ indicates the generation frequency of the reference clock generation unit 6.

However, in the conventional PLL circuit like this, the frequency divider outputs $a_2$ and $b_2$ are directly used as an input signal of the phase comparator 1. Therefore the PLL circuit directly suffers from the effects caused by grand bounce and overshoot generated when a logic value in the frequency divider 7 or 8 is inversed and a great phase noise is added to output of the VCO 4.

Figure 6:
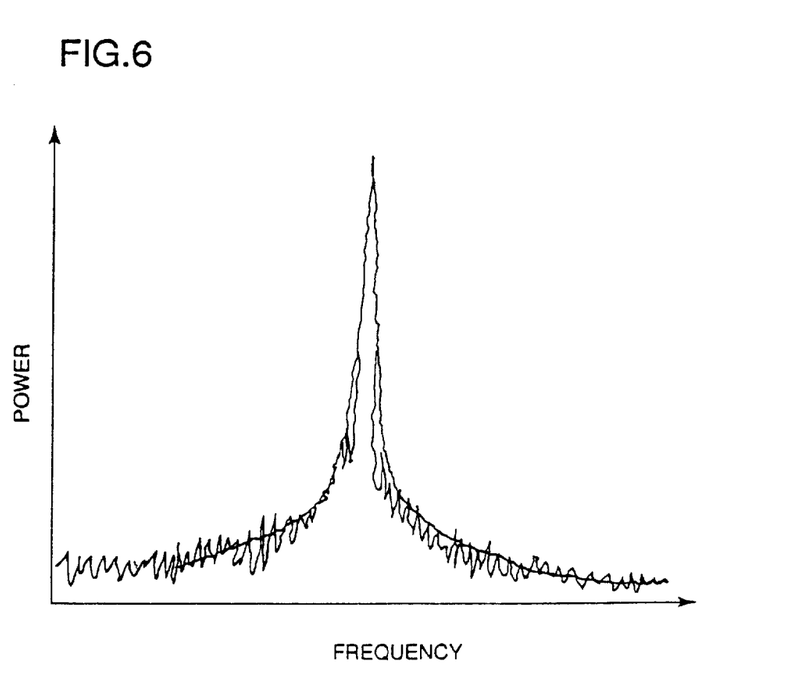
FIG. 6 is a diagram for explaining the problems with the conventional PLL circuit.

The process is explained, referring to FIGS. 5 from A to E. The FIG. 5A shows the input clocks $a_1$ and $b_1$ to the frequency dividers 7 and 8. The FIG. 5B shows the frequency divider outputs $a_2$ and $b_2$ from the frequency dividers 7 and 8. When the frequency divider 7 or 8 is triggered by the rising edge of the input clock $a_1$ or $b_1$ (at t1 in FIG. 5A), the frequency divider output signal $a_2$ or $b_2$ changes a little later (at t2 in FIG. 5B). FIG. 5C shows a noise caused by grand bounce and overshoot generated when a logic value in the frequency divider 7 or 8 is inversed. The noise is logically generated right after the input clocks $a_1$ and $b_1$ to the frequency dividers 7 and 8 are activated and coincidentally the frequency divider output signals $a_2$ and $b_2$ change. Therefore, as illustrated in the enlarged diagrams in FIGS. 5D and E, the effects produced by the noise generated in the frequency dividers 7 and 8 make the jitters in the phase of the frequency divider output signals $a_2$ and $b_2$. As a result, when the phases are compared and the PLL is operated here, an extra noise element as well as natural output is included in output of the VCO 4 as illustrated in FIG. 6.

SUMMARY OF THE INVENTION

The objective of the present invention is to solve the above-mentioned tasks.

Moreover, the objective of the invention is to provide the technology of a PLL circuit by which a phase noise added to output of a voltage controlled oscillator generated by a noise of a frequency divider is drastically reduced.

The objective of the present invention is achived by a noise reduction method of reducing a noise in a PLL circuit made by a frequency divider, said noise reduction method comprising: a clock signal generation step of generating a clock signal corresponding to an input control voltage; a frequency dividing step of dividing said clock signal simultaneously with being triggered by any of rising edge and falling edge of said clock signal and generating a first dividing signal; a delay step of taking said first dividing signal and delaying said dividing signal simultaneously with being triggered by one, that is not used as a trigger of said frequency dividing step, of said rising edge and falling edge of said clock signal; a reference clock generation step of generating a reference clock of a reference frequency; and a control voltage generation step of generating a control voltage corresponding to a phase difference between said delayed dividing signal and said reference clock.

Furthermore, the objective of the present invention is achived by a noise reduction method of reducing a noise in a PLL circuit made by a frequency divider, said noise reduction method comprising: a clock signal generation step of generating a clock signal corresponding to an input control voltage; a first frequency dividing step of dividing said clock signal for prescaling and generating a first dividing signal; a second frequency dividing step of dividing said first dividing signal simultaneously with being triggered by one of said rising edge and falling edge of said first dividing signal and generating said second dividing signal; a delay step of delaying said second dividing signal simultaneously with being triggered by one of said rising edge and falling edge of said second signal not used as a trigger of said frequency dividing step; a reference clock generation step of generating a reference clock of a reference frequency; and a control voltage generation step of generating a control voltage corresponding to a phase difference between said delayed second dividing signal and said reference clock.

In the abovementioned method, the noise reduction method may further comprise a a third frequency dividing step of dividing said reference clock simultaneously with being triggered by any of rising edge and falling edge of said reference clock signal and outputting said third dividing signal; and a second delay step of delaying and outputting said third dividing signal simultaneously with being triggered by one of said rising edge and falling edge of said reference clock signal not used as a trigger of said third frequency dividing step, and wherein said control voltage generation step comprises a step of generating a control voltage corresponding to a phase difference between said delayed second dividing signal and said delayed third dividing signal.

To realize the above-mentioned method, the first PLL circuit comprises voltage control oscillation means, frequency dividing means triggered by any of rising edge and falling edge of an output signal of the voltage control oscillation means for dividing and outputting the output signal of the voltage control oscillation means, flip-flop means triggered by one of the rising edge and falling edge of the output signal of the voltage control oscillation means not used as a trigger of the frequency dividing means for taking and outputting the output signal of the frequency dividing means, reference clock generation means, phase comparison means for recognizing the output signal from the flip-flop means and the reference clock from the reference clock generation means as input and outputting a voltage corresponding to the phase difference, and smooth means for smoothing the output voltage from the phase comparison means and making the output voltage a control voltage of the voltage control oscillation means.

In the first PLL circuit, when the frequency dividing means is supposed to be triggered by the rising edge of the output signal of the voltage control oscillation means, the flip-flop means is triggered by the falling edge of the output signal of the voltage control oscillation means and takes and outputs the output signal of the frequency dividing means.

Figure 1:
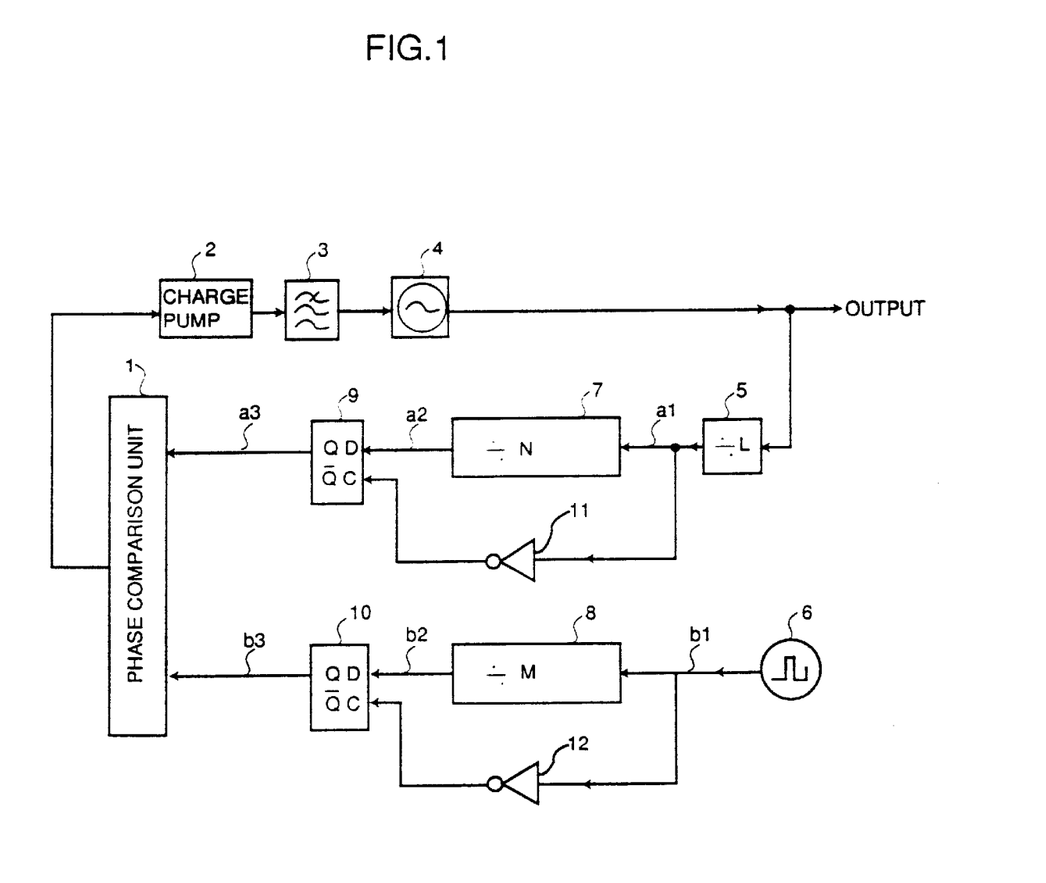
FIG. 1 is a block diagram showing the embodiment of the present invention.

Moreover, in the first PLL circuit, the voltage control oscillation means corresponds to the VCO 4 in the FIG. 1. The frequency dividing means corresponds to the frequency divider 7. The flip-flop means corresponds to the inverter 11 and the DFF 9. The reference clock generation means corresponds to the reference clock generation unit 6. The phase comparison means corresponds to the phase comparator 1. The smooth means corresponds to the charge pump 2 and the loop filter 3.

The second PLL circuit comprises a voltage control oscillation means, a prescaler for dividing and outputting an output signal of the voltage control oscillation means, frequency dividing means triggered by any of rising edge and falling edge of an output signal of the prescaler for dividing and outputting the output signal of the prescaler, flip-flop means triggered by one of the rising edge and falling edge of the output signal of the prescaler not used as a trigger of the frequency dividing means for taking and outputting the output signal of the frequency dividing means, reference clock generation means, phase comparison means for recognizing the output signal from the flip-flop means and the reference clock from the reference clock generation means as input and outputting a voltage corresponding to the phase difference, and smooth means for smoothing the output voltage from the phase comparison means and making the output voltage a control voltage of the voltage control oscillation means.

In the second PLL circuit, when the frequency dividing means is supposed to be triggered by the rising edge of the output signal of the prescaler, the flip-flop means is triggered by the rising edge of the output signal of the prescaler and takes and outputs the output signal of the frequency dividing means.

Moreover, in the second PLL circuit, the voltage control oscillation means corresponds to the VCO 4 in FIG. 1. The prescaler corresponds to the prescaler 5. The frequency dividing means corresponds to the frequency divider 7. The flip-flop means corresponds to the control voltage oscillation means not used as a trigger of the inverter 11 and the DFF 9. The reference clock generation means corresponds to the reference clock generation unit 6. the phase comparison means corresponds to the phase comparator 1. The smooth means corresponds to the charge pump 2 and the loop filter 3.

The third PLL circuit comprises voltage control oscillation means, first frequency dividing means triggered by any of rising edge and falling edge of an output signal of the voltage control oscillation means for dividing and outputting the output signal of the voltage control oscillation means, first flip-flop means triggered by one of the rising edge and falling edge of the output signal of the voltage control oscillation means not used as a trigger of the first frequency dividing means for taking and outputting the output signal of the first frequency dividing means, reference clock generation means, second frequency dividing means triggered by any of rising edge and falling edge of a reference clock of the reference clock generation means for dividing and outputting the reference clock from the reference clock generation means, second flip-flop means triggered by one of the rising edge and falling edge of the reference clock of the reference clock generation means not used as a trigger of the second frequency dividing means for taking and outputting the output signal of the second frequency dividing means, phase comparison means for recognizing the output signal from the first flip-flop means and the output signal from the second flip-flop means as input and outputting a voltage corresponding to the phase difference, and smooth means for smoothing the output voltage from the phase comparison means and making the output voltage a control voltage of the voltage control oscillation means.

In the third PLL circuit, when the first frequency dividing means is supposed to be triggered by the rising edge of the output signal of the voltage control oscillation means, the first flip-flop means is triggered by the rising edge of the voltage control oscillation means and takes and outputs the output signal of the first frequency dividing means. In addition, when the second frequency dividing means is supposed to be triggered by the rising edge of the reference clock, the second flip-flop means is triggered by the falling edge of the reference clock and takes and outputs the output signal of the second frequency dividing means.

In the third PLL circuit, the voltage control oscillation means corresponds to the VCO 4 in FIG. 1. The first frequency dividing means corresponds to the frequency divider 7. The first flip-flop means corresponds to the inverter 11 and the DFF 9. The reference clock generation means corresponds to the reference clock generation unit 6. The second frequency dividing means corresponds to the frequency divider 8. The second flip-flop means corresponds to the inverter 12 and the DFF 10. The phase comparison means corresponds to the phase comparator 1. The smooth means corresponds to the charge pump 2 and the loop filter 3.

The fourth PLL circuit comprises voltage control oscillation means, a prescaler for dividing and outputting an output signal of the voltage control oscillation means, first frequency dividing means triggered by any of rising edge and falling edge of an output signal of the prescaler for dividing and outputting the output signal of the prescaler, first flip-flop means triggered by one of the rising edge and falling edge of the output signal of the prescaler not used as a trigger of the first frequency dividing means for taking and outputting the output signal of the first frequency dividing means, reference clock generation means, second frequency dividing means triggered by any of rising edge and falling edge of a reference clock of the reference clock generation means for dividing and outputting the reference clock of the reference clock generation means, second flip-flop means triggered by one of the rising edge and falling edge of the reference clock of the reference clock generation means not used as a trigger of the second frequency dividing means for taking and outputting the output signal of the second frequency dividing means, phase comparison means for recognizing the output signal from the first flip-flop means and the output signal from the second flip-flop means as input and outputting a voltage corresponding to the phase difference, and smooth means for smoothing the output voltage from the phase comparison means and making the output voltage a control voltage of the voltage control oscillation means.

In the fourth circuit, when the first frequency dividing means is supposed to be triggered by the rising edge of the output signal of the prescaler, the first flip-flop means is triggered by the rising edge of the output signal of the prescaler and takes and outputs the output signal of the first frequency dividing means. In addition, when the second frequency dividing means is supposed to be triggered by the rising edge of the reference clock, the second flip-flop means is triggered by the rising edge of the reference clock, and takes and outputs the output signal of the second frequency dividing means.

In the fourth PLL circuit, the voltage control oscillation means corresponds to the VCO 4 in FIG. 1. The prescaler corresponds to the prescaler 5. The first frequency dividing means corresponds to the frequency divider 7. The first flip-flop means corresponds to the inverter 11 and the DFF 9. The reference clock generation means corresponds to the reference clock generation unit 6. The second frequency dividing means corresponds to the frequency divider 8. The second flip-flop means corresponds to the inverter 12 and the DFF 10. The phase comparison means corresponds to the phase comparator 1. The smooth means corresponds to the charge pump 2 and the loop filter 3.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

The present invention is explained in detail, referring to the embodiments. FIG. 1 is a block diagram of the PLL circuit showing the embodiment of the present invention. In FIG. 1 and FIG. 4. the same symbols indicate the same composition elements and the same composition elements in FIG. 4 are not explained. In this embodiment, the D flip-flops (referred to as DFF, hereinafter) 9 and 10 and the inverters 11 and 12 are added to the conventional circuit composition shown in FIG. 4. The frequency divider output $a_2$ is provided to the D input of the DFF 9. The input clock al to the frequency divider 7 is inversed by the inverter 11 then provided to the C input of the DFF 9. The frequency divider output $b_2$ is given to the D input of the DFF 10. The input clock $b_1$ to the frequency divider 8 is inversed by the inverter 12 then given to the C input of the DFF 10. The Q output of the DFF 9 and the Q output of the DFF 10 are given to the phase comparator 1 as the output signals $a_3$ and $b_3$ respectively.

In the DFF 9 of the PLL circuit, the frequency divider output $a_2$ synchronized with the clock generated by inversing the input clock al by the inverter 11 and the input $a_2$ is output to the phase comparator 1 as the output signal $a_3$.

In the DFF 10, the frequency divider output $b_2$ synchronized with the clock generated by inversing the input clock $b_1$ that is sent to the frequency divider 8 by the inverter 12 and the input $b_2$ is output to the phase comparator 1 as the output signal $b_3$. When the DFF's 9 and 10 and the frequency dividers 7 and 8 are triggered by the rising edge of the drive clock, the frequency dividers 7 and 8 are triggered by the rising edges of the input clocks $a_1$ and $b_1$, respectively. The DFF's 9 and 10 are triggered by the rising edges of the input clocks $a_1$ and $b_1$.

The process is explained, referring to FIG. 2. FIG. 2 A, B, C, D, E correspond to FIG. 5 A, B, C, D, E and FIG. 2 F and G indicate the output signals $a_3$ and $b_3$ of the flip-flops 9 and 10. As shown in the time chart, in the DFF 9, the frequency divider output $a_2$ is input at t3 half round behind the input clock $a_1$ and used as the output signal $a_3$. In the DFF 10, the frequency divider output $b_2$ is input at t3 half round behind the input clock $b_1$ and used the output signal $b_3$.

Figure 2A:
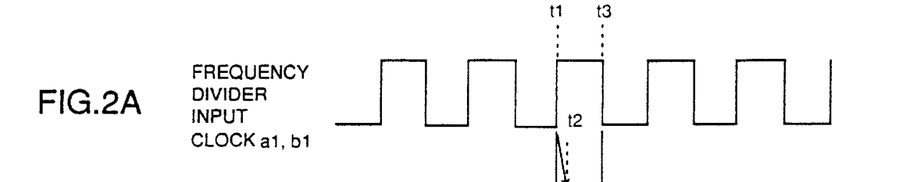
FIGS. 2A to 2G are time charts for explaining the operations of the embodiment.
Figure 2B:
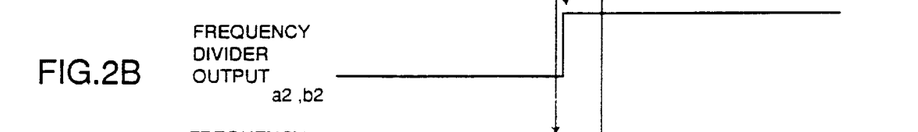
Figure 2C:
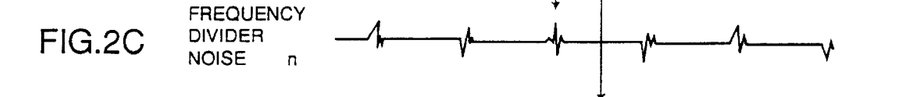
Figure 2D:
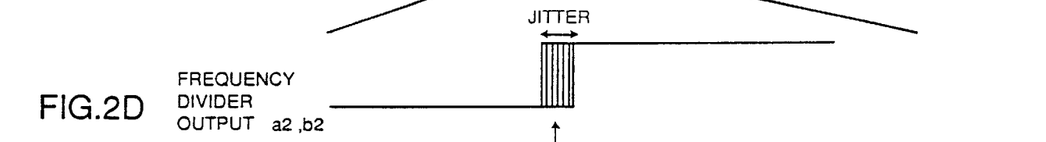
Figure 2E:
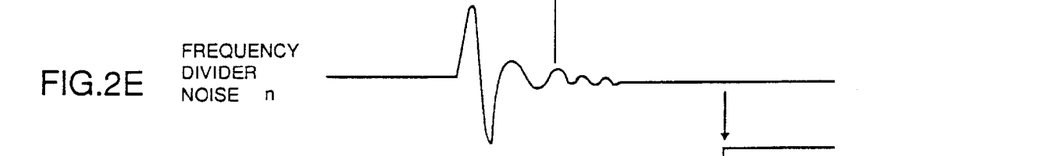
Figure 2F:
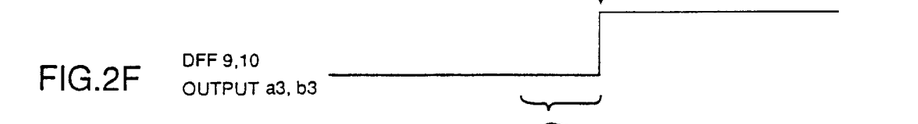
Figure 2G:
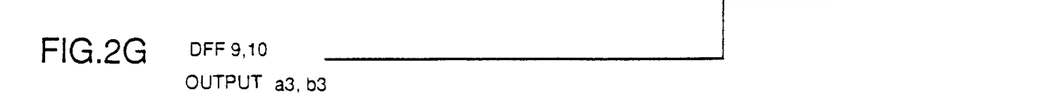
Figure 3:
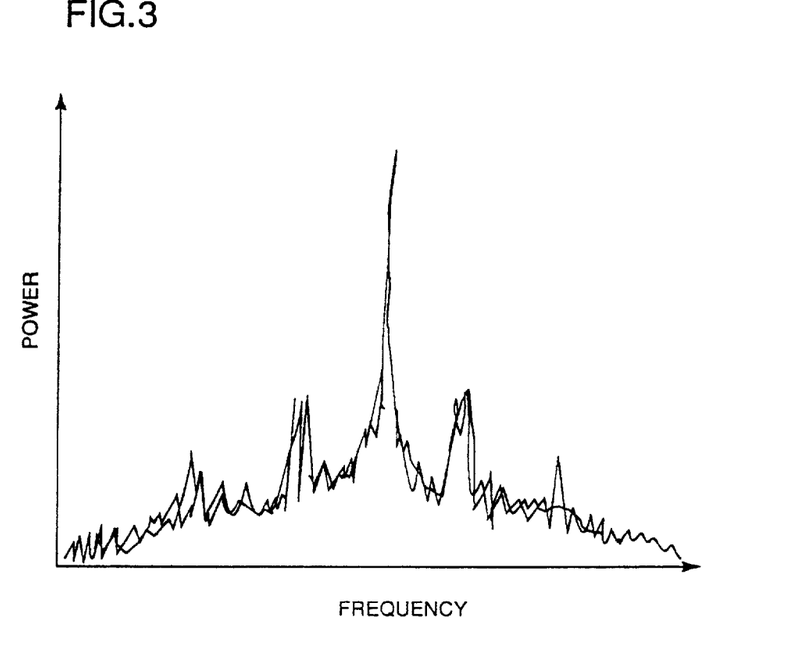
FIG. 3 is a diagram for explaining the spurious reduction effects of the embodiment.

FIG. 2D, E and G are enlarged FIG. B, C, F respectively. As shown in FIG. 2 D, E and G, in this PLL circuit, the noise in the frequency dividers 7 and 8 generates the phase jitters in the frequency divider outputs $a_2$ and $b_2$. However when the frequency divider outputs $a_2$ and $b_2$ are taken into the DFF's 9 and 10 at the point half round behind the input clocks $a_1$ and $b_1$ and given to the phase comparator 1 as the output signals $a_3$ and $b_3$, the phase jitters is drastically reduced. In this way, the phase noise added to output of the VCO 4 is greatly reduced as shown in FIG. 3.

In this embodiment, the DFF's 9 and 10 and the frequency dividers 7 and 8 are supposed to be triggered together by the rising edge of the drive clock, however the falling edge can be used instead. In addition, in this embodiment, the prescaler 5 is supposed to be set previous to the frequency divider 7 and, however, the prescaler 5 can be omitted. Moreover, in this embodiment, the frequency divider 8, the DFF 10 and the inverter 12 are set for the reference clock $b_1$, provided that the generation frequency $f_r$ of the reference clock generation unit 6 is high and the frequency divider 8, the DFF 10 and the inverter 12 can be omitted by specifying any low value for the generation frequency $f_r$ of the generation unit 6.

As explained above, in this invention, the output signal of the frequency dividing means is taken into the flip-flop means at the timing when a noise is small and given to the phase comparison means. As a result, the phase noise added to output of the voltage controlled oscillator generated by the noise of the frequency divider can drastically be reduced.

What is claimed is:

1. A PLL circuit comprising:

voltage control oscillation means for generating and outputting a signal of a frequency corresponding to an input control voltage;

frequency dividing means triggered by any of a rising edge and falling edge of an output signal of said voltage control oscillation means, for dividing said output signal of said voltage control oscillation means;

a flip-flop connected to an inverter, said flip-flop triggered by one, that is not used as a trigger of said frequency dividing means, of said rising edge and falling edge of said output signal of said voltage control oscillation means for receiving and outputting said output signal of said frequency dividing means;

reference clock generation means for generating a reference clock of reference frequency; and phase comparison means for outputting a voltage corresponding to a phase difference between an output signal of said flip-flop and said reference clock.

2. The PLL circuit of claim 1, further comprising smooth means for smoothing an output voltage of said phase comparison means and outputting said smoothed voltage as a control voltage of said voltage control oscillation means.

3. A PLL circuit comprising:

voltage control oscillation means for generating and outputting a signal of a frequency corresponding to an input control voltage;

a prescaler dividing said output signal of said voltage control oscillation means;

frequency dividing means triggered by any of a rising edge and falling edge of said output signal of said prescaler for dividing and outputting said output signal of said prescaler;

a flip-flop connected to an inverter, said flip-flop triggered by one, that is not used as a trigger of said frequency dividing means, of said rising edge and falling edge of said output signal of said prescaler for receiving and outputting said output signal of said frequency dividing means;

reference clock generation means for generating a reference clock of a reference frequency; and phase comparison means for outputting a voltage corresponding to a phase difference between said output signal of said flip-flop and said reference clock.

4. The PLL circuit of claim 3, further comprising smooth means for smoothing an output voltage of said phase comparison means and outputting said smoothed voltage as a control voltage of said voltage control oscillation means.

5. A PLL circuit comprising:

voltage control oscillation means for generating and outputting a signal of a frequency corresponding to an input control voltage;

first frequency dividing means triggered by any of a rising edge and falling edge of said output signal of said voltage control oscillation means, for dividing said output signal of said voltage control oscillation means;

a first flip-flop connected to a first inverter, said first flip-flop triggered by one, that is not used as a trigger of said first frequency dividing means, of said rising edge and falling edge of said output signal of said voltage control oscillation means for receiving and outputting said output signal of said first frequency dividing means;

reference clock generation means for generating a reference clock of a reference frequency;

second frequency dividing means triggered by any of a rising edge and falling edge of said reference clock for dividing said reference clock;

a second flip-flop connected to a second inverter, said second flip-flop triggered by one, that is not used as a trigger of said second frequency dividing means, of a rising edge and falling edge of said reference clock from said reference clock generation means for receiving and outputting said output signal of said second frequency dividing means; and phase comparison means for outputting a voltage corresponding to a phase difference between said output signal of said first flip-flop and said output signal of said second flip-flop.

6. The PLL circuit of claim 5, further comprising smooth means for smoothing an output voltage of said phase comparison means and outputting said smoothed voltage as a control voltage of said voltage control oscillation means.

7. A PLL circuit comprising:

voltage control oscillation means for generating and outputting a signal of a frequency corresponding to an input control voltage;

a prescaler dividing and outputting said output signal of said voltage control oscillation means;

first frequency dividing means triggered by any of a rising edge and falling edge of said output signal of said prescaler, for dividing said output signal of said prescaler;

a first flip-flop connected to a first inverter, said first flip-flop triggered by one, that is not used as a trigger of said first frequency dividing means, of said rising edge and falling edge of said output signal of said prescaler for receiving and outputting said output signal of said first frequency dividing means;

reference clock generation means for generating a reference clock of a reference frequency;

second frequency dividing means triggered by any of rising edge and falling edge of said reference clock, for dividing and outputting said reference clock from said reference clock generation means;

a second flip-flop connected to a second inverter. said second flip-flop triggered by one, that is not used as a trigger of said second frequency dividing means, of said rising edge and falling edge of said reference clock from said reference clock generation means for receiving and outputting said output signal of said second frequency dividing means; and phase comparison means for outputting a voltage corresponding to a phase difference between said output signal of said first flip-flop and said output signal of said second flip-flop.

8. The PLL circuit of claim 7, further comprising smooth means for smoothing said output voltage of said phase comparison means and outputting said smoothed voltage as a control voltage of said voltage control oscillation means.

9. A noise reduction method of reducing a noise in a PLL circuit made by a frequency divider, said noise reduction method comprising:

a clock signal generation step of generating a clock signal corresponding to an input control voltage;

a frequency dividing step of dividing said clock signal simultaneously with being triggered by any of a rising edge and falling edge of said clock signal and generating a first dividing signal;

a delay step of taking said first dividing signal and delaying said dividing signal simultaneously with being triggered by one, that is not used as a trigger of said frequency dividing step, of said rising edge and falling edge of said clock signal;

a reference clock generation step of generating a reference clock of a reference frequency; and a control voltage generation step of generating a control voltage corresponding to a phase difference between said delayed dividing signal and said reference clock.

10. The noise reduction means of claim 9, further comprising a step of smoothing a control voltage.

11. The noise reduction method of claim 9, further comprising:
   a second frequency dividing step of dividing said reference clock signal simultaneously with triggered by any of rising edge and falling edge of said reference clock and outputting second dividing signal; and
   a second delay step of taking said second dividing signal and delaying and outputting said second dividing signal after being triggered by one, that is not used as a trigger of said second frequency dividing step, of said rising edge and falling edge of said reference clock and
   wherein said control voltage generation step comprises a step of generating a control voltage corresponding to a phase difference between said delayed first dividing signal and said delayed second dividing signal.

12. A noise reduction method of reducing a noise in a PLL circuit made by a frequency divider, said noise reduction method comprising:
   a clock signal generation step of generating a clock signal corresponding to an input control voltage;
   a first frequency dividing step of dividing said clock signal for prescaling and generating a first dividing signal;
   a second frequency dividing step of dividing said first dividing signal simultaneously with being triggered by one of said rising edge and falling edge of said first dividing signal and generating said second dividing signal;
   a delay step of delaying said second dividing signal simultaneously with being triggered by one of said rising edge and falling edge of said first signal not used as a trigger of said frequency dividing step;
   a reference clock generation step of generating a reference clock of a reference frequency; and
   a control voltage generation step of generating a control voltage corresponding to a phase difference between said delayed second dividing signal and said reference clock.

13. The noise reduction method of claim 12, further comprising a step of smoothing a control voltage.

14. The noise reduction method of claim 12, further comprising:
   a third frequency dividing step of dividing said reference clock simultaneously with being triggered by any of rising edge and falling edge of said reference clock signal and outputting said third dividing signal; and
   a second delay step of delaying and outputting said third dividing signal simultaneously with being triggered by one of said rising edge and falling edge of said reference clock signal not used as a trigger of said third frequency dividing step, and
   wherein said control voltage generation step comprises a step of generating a control voltage corresponding to a phase difference between said delayed second dividing signal and said delayed third dividing signal.

15. A PLL circuit comprising:
   a voltage control oscillator generating and outputting a signal of a frequency corresponding to an input control voltage;
   a frequency divider triggered by any of a rising edge and falling edge of an output signal of said voltage control oscillator, and dividing said output signal of said voltage control oscillator;
   a flip-flop connected to an inverter, said flip-flop triggered by one, that is not used as a trigger of said frequency divider, of said rising edge and falling edge of said output signal of said voltage control oscillator to receive and output said output signal of said frequency divider;
   a reference clock generation device generating a reference clock of reference frequency; and
   a phase comparison device outputting a voltage corresponding to a phase difference between an output signal of said flip-flop and said reference clock.

16. The PLL circuit of claim 15, further comprising a filter smoothing an output voltage of said phase comparison device and outputting said smoothed voltage as a control voltage of said voltage control oscillator.

17. A PLL circuit comprising:
   a voltage control oscillator generating and outputting a signal of a frequency corresponding to an input control voltage;
   a prescaler dividing said output signal of said voltage control oscillator;
   a frequency divider triggered by any of a rising edge and falling edge of said output signal of said prescaler;
   a flip-flop connected to an inverter, said flip-flop triggered by one, that is not used as a trigger of said frequency divider, of said rising edge and falling edge of said output signal of said prescaler for taking and outputting said output signal of said frequency divider;
   a reference clock generation device generating a reference clock of a reference frequency; and
   a phase comparison device outputting a voltage corresponding to a phase difference between said output signal of said flip-flop and said reference clock.

18. The PLL circuit of claim 17, further comprising a filter smoothing an output voltage of said phase comparison device and outputting said smoothed voltage as a control voltage of said voltage control oscillator.

19. A PLL circuit comprising:
   a voltage control oscillator generating and outputting a signal of a frequency corresponding to an input control voltage;
   a first frequency divider triggered by any of a rising edge and falling edge of said output signal of said voltage control oscillator and dividing said output signal of said voltage control oscillator;
   a first flip-flop connected to a first inverter, said first flip-flop triggered by one, that is not used as a trigger of said first frequency divider, of said rising edge and falling edge of said output signal of said voltage control oscillator to receive and output said output signal of said first frequency divider;
   a reference clock generation device generating a reference clock of a reference frequency;
   a second frequency divider triggered by any of a rising edge and falling edge of said reference clock to divide said reference clock;
   a second flip-flop connected to a second inverter, said second flip-flop triggered by one, that is not used as a trigger of said second frequency divider, of a rising edge and falling edge of said reference clock from said reference clock generation device to receive and output said output signal of said second frequency divider; and a phase comparison device outputting a voltage corresponding to a phase difference between said output signal of said first flip-flop and said output signal of said second flip-flop.

20. The PLL circuit of claim 19, further comprising a filter smoothing an output voltage of said phase comparison device and outputting said smoothed voltage as a control voltage of said voltage control oscillator.

21. A PLL circuit comprising:

a voltage control oscillator generating and outputting a signal of a frequency corresponding to an input control voltage;

a prescaler dividing and outputting said output signal of said voltage control oscillator;

a first frequency divider triggered by any of a rising edge and falling edge of said output signal of said prescaler, and dividing said output signal of said prescaler;

a first flip-flop connected to a first inverter, said first flip-flop triggered by one, that is not used as a trigger of said first frequency divider, of said rising edge and falling edge of said output signal of said prescaler to receive and output said output signal of said first frequency divider;

a reference clock generation device generating a reference clock of a reference frequency;

a second frequency divider triggered by any of a rising edge and falling edge of said reference clock, and dividing and outputting said reference clock from said reference clock generation device;

a second flip-flop connected to a second inverter, said second flip-flop triggered by one, that is not used as a trigger of said second frequency divider, of said rising edge and falling edge of said reference clock from said reference clock generation device to receive and output said output signal of said second frequency divider;

a phase comparison device outputting a voltage corresponding to a phase difference between said output signal of said first flip-flop and said output signal of said second flip-flop;

a charge pump for receiving said output voltage from said phase comparator device and outputting a voltage corresponding to said output voltage; and a loop filter for smoothing said output voltage from said charge pump and outputting a smoothed voltage to said voltage control oscillator as said input control voltage.

22. The PLL circuit of claim 21, further comprising a filter smoothing said output voltage of said phase comparison device and outputting said smoothed voltage as a control voltage of said voltage control oscillator.

* * * * *